United States Patent [19]
Chapman et al.

[11] 3,970,943
[45] July 20, 1976

[54] ANALOG-TO-PULSE INTEGRATING CONVERTER

[75] Inventors: Everett E. Chapman, Ipswich; Thomas H. Crocker, Burlington; Barry N. Levitt, Framingham, all of Mass.

[73] Assignee: The United States of America as represented by the Secretary of the Air Force, Washington, D.C.

[22] Filed: Mar. 27, 1975

[21] Appl. No.: 563,011

[52] U.S. Cl. .............................. 328/151; 307/271; 328/127
[51] Int. Cl.² ......................................... H03K 1/16
[58] Field of Search ............ 328/128, 127, 63, 151; 307/235 R, 271, 228

[56] References Cited
UNITED STATES PATENTS

| | | |
|---|---|---|
| 3,743,951 | 7/1973 | Carroll ................................ 328/127 |
| 3,764,831 | 10/1973 | Zwitter et al. ...................... 328/127 |
| 3,893,036 | 7/1975 | Cavoretto et al. ................... 307/228 |

Primary Examiner—John Zazworsky
Assistant Examiner—Marcus S. Rasco
Attorney, Agent, or Firm—Joseph E. Rusz; George Fine

[57] ABSTRACT

An analog-to-pulse integrating converter uses dual slope integration to achieve DC voltage to pulse rate conversion. An input signal is integrated, the integrator output is level detected and the integrator reset, at the same time there is issued an output pulse. The output pulse rate is proportional to the level of the DC input signal.

2 Claims, 11 Drawing Figures

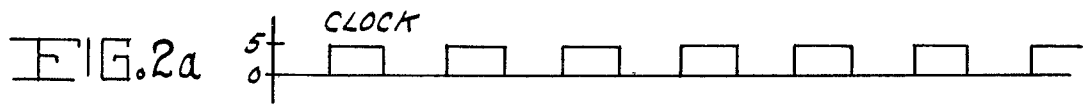
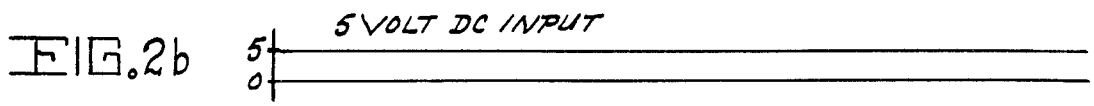
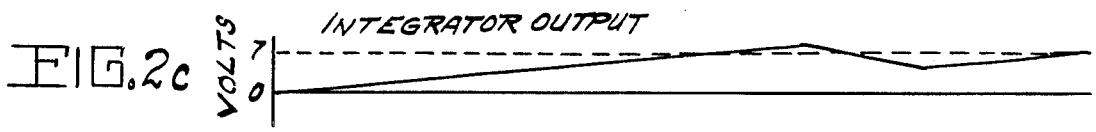
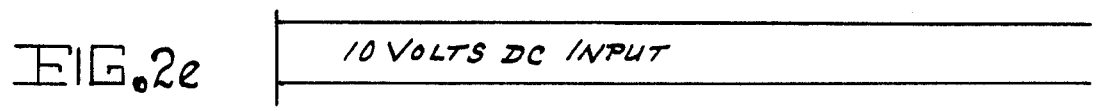
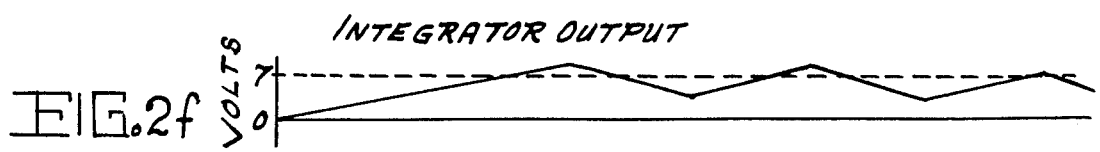
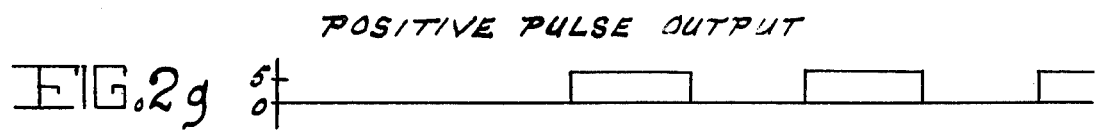
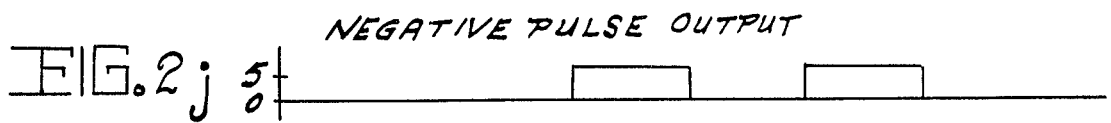

ANALOG-TO-PULSE INTEGRATING CONVERTER

STATEMENT OF GOVERNMENT INTEREST

The invention herein described may be manufactured and used by or for the Government for governmental purposes without the payment of any royalty thereon.

BACKGROUND OF THE INVENTION

The analog-to-pulse integrating converter (APIC) is a new and improved circuit. The APIC circuit is an innovative means of accomplishing analog voltage-to-pulse rate conversion, and as such, could find more general usage in digital transmission, electronic testing, and telemetering applications.

Since the primary use of the APIC circuit is in interfacing analog DC voltages with digital computers, its design approach and characteristics can be compared with both standard analog-to-digital converters and with other devices yielding a pulse rate output for a DC input. The comparison will enable one to appreciate the unique design features and resulting advantages of the APIC circuit described in this invention disclosure.

Standard analog-to-digital converters can provide an almost continuous digital parallel output proportional to a DC input. For more than one input, multiplexing can be used to reduce the number of converters necessary. The accuracy of the parallel converter, however, is limited by the maximum number of output bits and circuit noise. To obtain 0.05 percent resolution, a 12-bit converter must be used; if greater resolution is required, converters with even more bits are needed. Standard converters of more than 12-bit range tend to be expensive. Greater resolution is even harder to obtain and approaches the state-of-the-art for this type of equipment.

In applications where the input signal can be integrated, the conversion and integration can be accomplished simultaneously, resulting in a pulse train output where the number of pulses represent the integral of the DC input. By doing this, the resolution obtainable is limited only by the range of the device counting the pulses, the converter component errors and the integrated signal noises.

The present APIC circuit 1) has its output synchronized with an applied clock signal; 2) applies the voltage reset function at a constant amplitude and width by using voltage regulation and analog switching techniques; 3) operates on a bipolar input yielding a bipolar output with a zero mean, and 4) has the capability for independent positive and negative scale factor adjustments. In addition, by using an input to the pulse generating flip-flop reset terminal, the APIC output pulses can be time-correlated with a digital input function such as a computer clock. This will enable synchronization of pulse output times and computer interrupts so that additional peripheral input logic would not be necessary in this instance.

Due to these design features, the APIC circuit possesses higher accuracy and less temperature and voltage sensitivity than other comparable devices. Representative conversion circuit claims show accuracies of no less than 0.01 percent, while tests have shown the APIC accuracy to be at 0.009 percent.

SUMMARY OF THE INVENTION

An analog-to-pulse integrating converter is provided. Analog DC input voltages are converted to digital pulse trains at pulse rates proportional to input accelerations. The current uses a dual slope integration method to achieve DC voltage to pulse rate conversion. The principle involved is to integrate the input signal, level detect the integrator output and reset the integrator, at the same time issuing an output pulse. Therefore, the pulse output rate would be proportional to the level of the DC input voltage.

DETAILED DESCRIPTION OF PREFERRED EMBODIMENT

Figure 1:
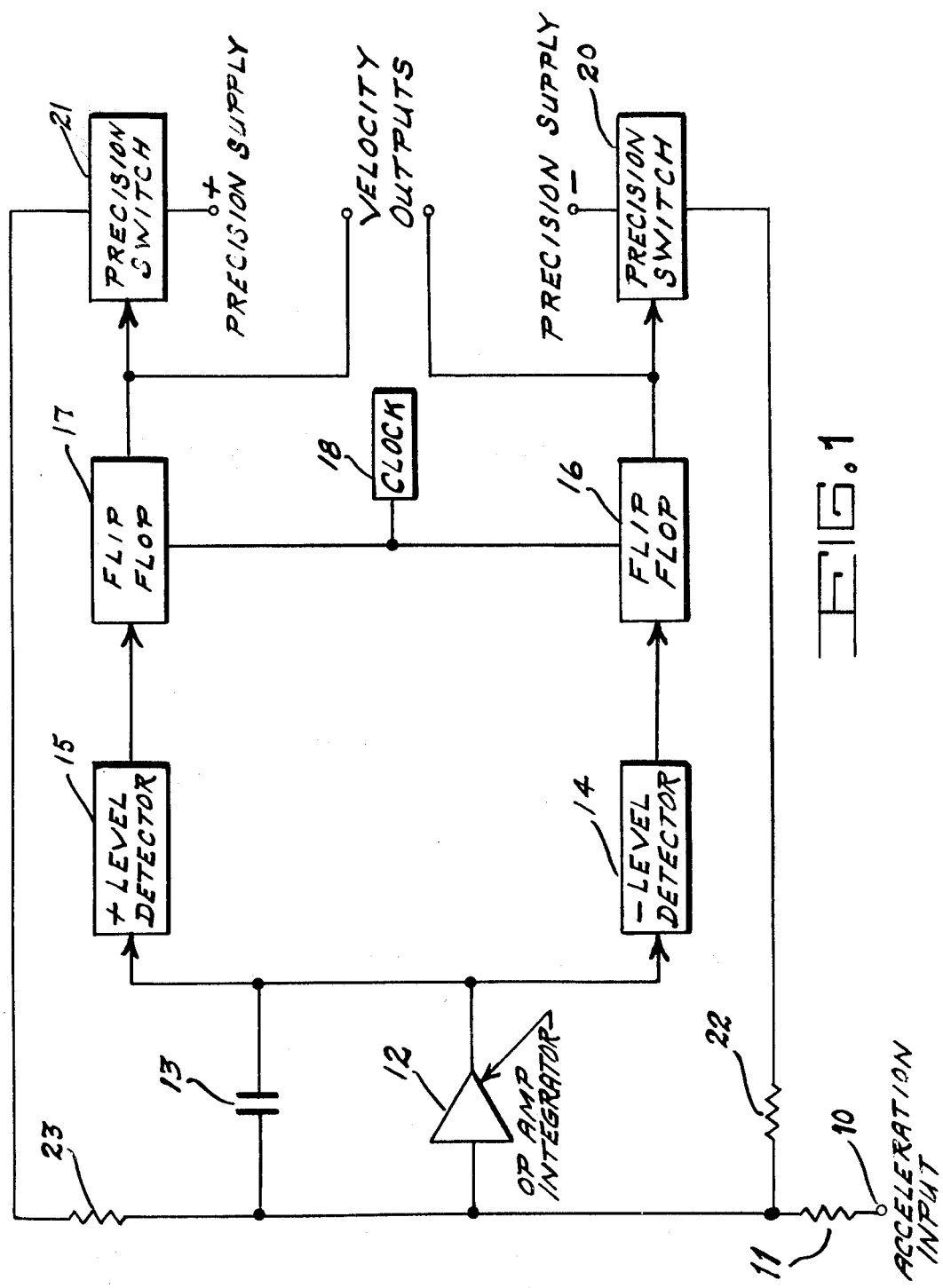
FIG. 1 shows in block diagram form the preferred embodiment of the analog-to-pulse integrator convertor; and FIG. 2a through FIG. 2j illustrates typical waveforms associated with the analog-to-pulse integrator converter of FIG. 1.

Now referring in detail to FIG. 1, there is shown input terminal 10 which receives a bipolar analog DC voltage which is fed through input resistor 11 to analog integrator 12. The input signal may be of the type such as accelerometer output signals to be converted to digital pulse trains at pulse rates proportional to input accelerations. Analog integrator 12 may be an operational amplifier integrator including feedback capacitor 13. Integrator 12 may use the LM101A type operational amplifier. Analog integrator 12 yields as its output, the integral of the input signal at a scale factor dependent on input resistor 11 and feedback capacitor 13.

The positive or negative swinging output from integrator 12 is monitored by two separate level detectors 14 and 15; detector 15 for positive levels and detector 14 for negative levels. The level detectors may be two LM101A integrated circuits which are employed as comparators, or any other conventional level detector may be used. The reference voltages for these detectors may be precise plus and minus seven volt signals. As the integrator output reaches these levels, either positively or negatively, the output of the appropriate level detector (comparator) goes to a positive level. Thus, when the integrator output reaches the predetermined level criteria, its detector circuitry switches to indicate a positive response at its output.

The level detector outputs are utilized to permit a clocked synchronized output to be obtained from flip-flops 16 and 17. Level detectors 14 and 15 feed flip-flops 16 and 17, respectively. When a positive level detector output occurs, the corresponding part of the flip-flop is set. The set condition of either the plus or minus part of the flip-flop will establish a current output. Each output pulse can be measured as a quantum of velocity, with the pulse rate being directly proportional to the input DC analog acceleration signal.

The plus or minus output level of flip-flops 16 or 17 also excites the corresponding analog precision switch 20 or 21 which may be any conventional electronic switch actuated by a pulse input. When excited, the switch applies a precise minus or plus 7-volt DC reference voltage through resistors 22 or 23 back to analog integrator 12. The polarity of the circuit is such that a positive acceleration input voltage will result in signal in the positive velocity output lines and a negative feedback from the analog precision switch. The feedback signal causes the integrator output to drop, thus causing the level detector output to go negative so that on the next clock pulse, the pulse generating flip-flop is reset. The circuit gain was determined so that the reset always occurs between clock pulses in order that the output pulse width be set at the clock period.

It is emphasized that when the ingegrator output reaches the predetermined level criteria, the detector circuitry switches to indicate a positive response at its output. This signal is gated with a clock pulse to serve as a synchronized circuit output and to provide feedback to the input of the integrator, weighted so that it represents to precise reset control by applying a fixed voltage pulse of a polarity of opposite to that of the original input. The closed loop principle insures that the integrator output stays within the linear range between two level detector boundaries. The selection of the circuit range and resolution is readily accomplished by a variation of only the gain of the integrator and the frequency of the clock.

Typical waveforms are shown in FIGs. 2a through 2j. These illustrate how the DC bipolar input level can be used to generate a proportional pulse rate output by employing the dual slope integration technique.

The accuracy of the circuit is primarily dependent on the linearity of the integrator and the preciseness by which the result is applied. The amount of reset for each output condition is selected to minimize the integrator and reset pulse requirements for a given input range

What is claimed is:

1. An analog-to-pulse integrating converter being comprised of analog means to integrate a bipolar DC signal, a feedback capacitor for said integrating means, an input resistor connected to said analog integrator means, said input resistor receiving said bipolar DC signal with said analog integrating means yielding as an output signal, the integral of the bipolar DC signal at a scale factor dependent on said input resistor and said feedback capacitor, said output signal also being positive or negative swinging, first and second level detector receiving the output signals from said analog integrating means, said first level detector being for positive levels and the second for negative levels, with said level detectors providing pulse output signals when said analog integrating means reaches a predetermined level, clock means to provide pulses at a predetermined frequency, first and second flip-flops receiving output pulses from said first and second level detectors, respectively, said first and second flip-flops also receiving the clock pulses to permit clocked synchronized first and second output pulses to be obtained from said first and second flip-flops, respectively, first and second positive and negative predetermined reference voltage sources normally disconnected, and switching means to connect said positive and negative reference voltage sources to said integrating means upon receiving said clocked synchronized first and second output pulses, respectively.

2. An analog-to-pulse integrating converter as described in claim 1 wherein said first and second level detectors consist of first and second comparators.

* * * * *